… | | …
United States Patent [19]

Zemek et al.

[11] Patent Number: 4,501,065

[45] Date of Patent: Feb. 26, 1985

[54] WIRE PIN INSERTION METHOD AND APPARATUS

[75] Inventors: Albert W. Zemek, Windsor, N.Y.; Arthur T. Carlsen, Hallstead, Pa.

[73] Assignee: Universal Instruments Corporation, Binghamton, N.Y.

[21] Appl. No.: 414,906

[22] Filed: Sep. 3, 1982

[51] Int. Cl.³ .............................................. H05K 3/00
[52] U.S. Cl. ....................................... 29/845; 227/95; 227/97
[58] Field of Search ................ 29/844, 845, 747, 739; 227/94, 95, 97, 116

[56] References Cited

U.S. PATENT DOCUMENTS

| 4,166,316 | 9/1979 | Misawa et al. | 29/845 |
| 4,265,013 | 5/1981 | Brown et al. | 29/845 X |
| 4,429,456 | 2/1984 | Zahn | 29/837 X |
| 4,776,448 | 12/1979 | Zahn et al. | 29/739 X |

*Primary Examiner*—Howard N. Goldberg
*Assistant Examiner*—Carl J. Arbes
*Attorney, Agent, or Firm*—Fidelman, Wolffe & Waldron

[57] ABSTRACT

A method and apparatus are provided for consistently handling, inserting, and driving wire pins of reduced cross-section into circuit board holes and the like while retaining control of the pins and avoiding breakage of the apparatus due to constraints imposed thereon by such reduced cross-section.

6 Claims, 21 Drawing Figures

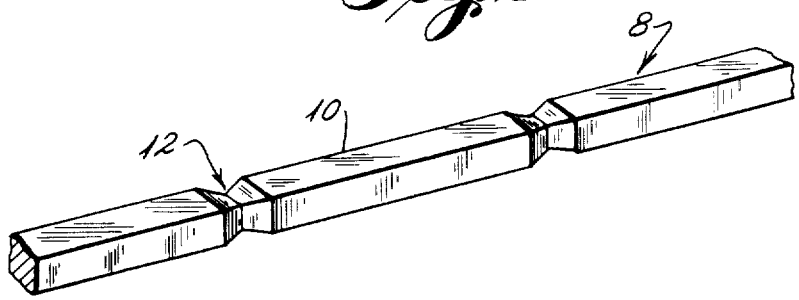
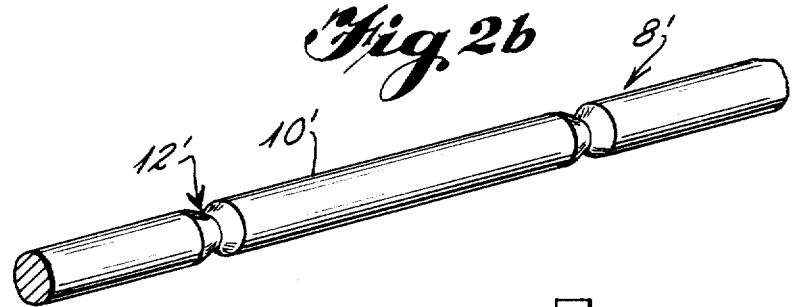
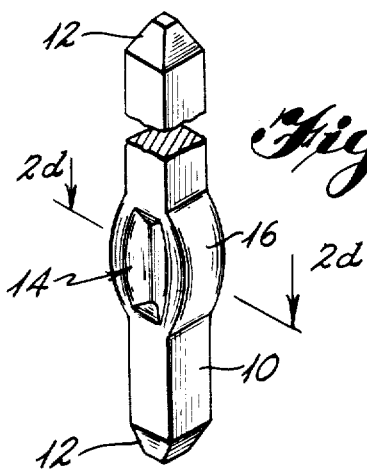
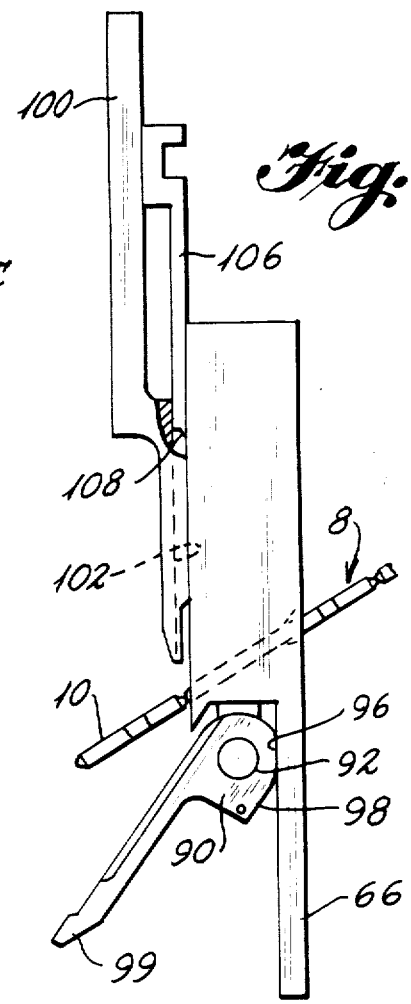
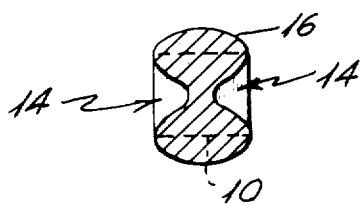

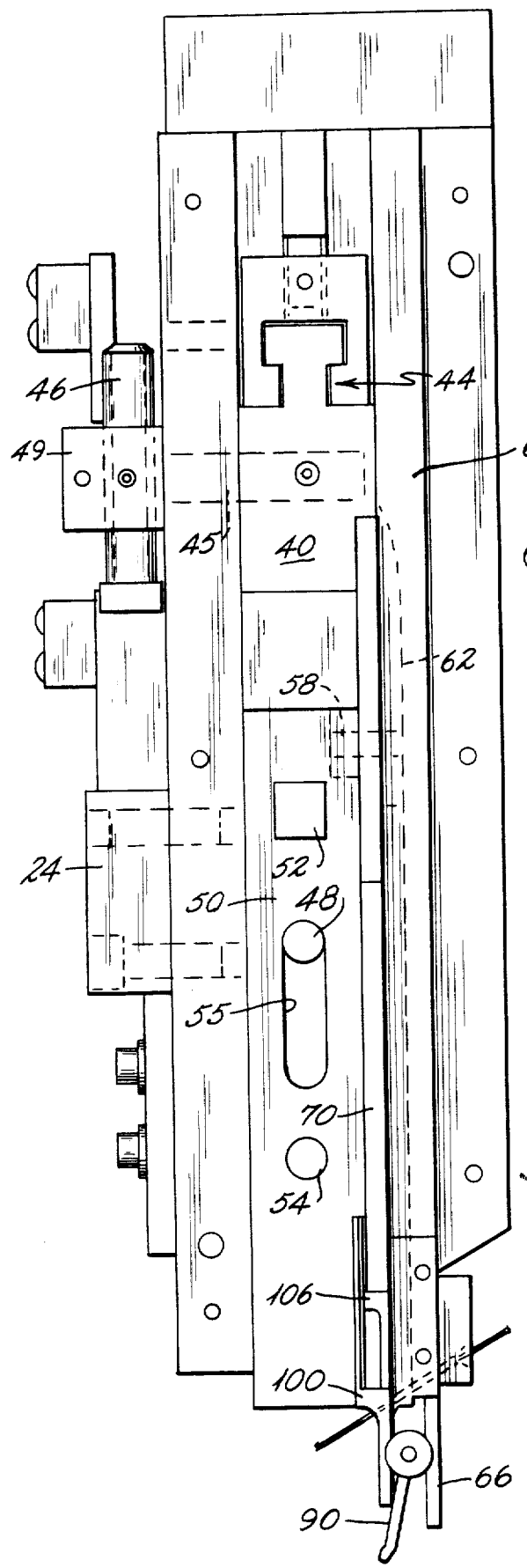
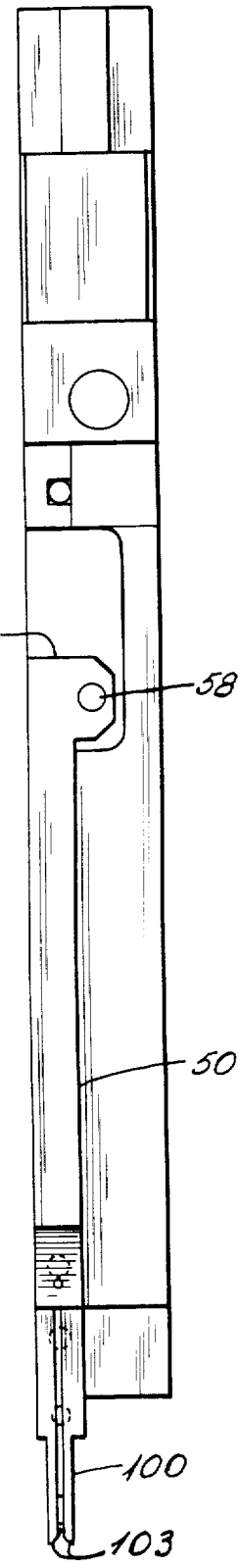

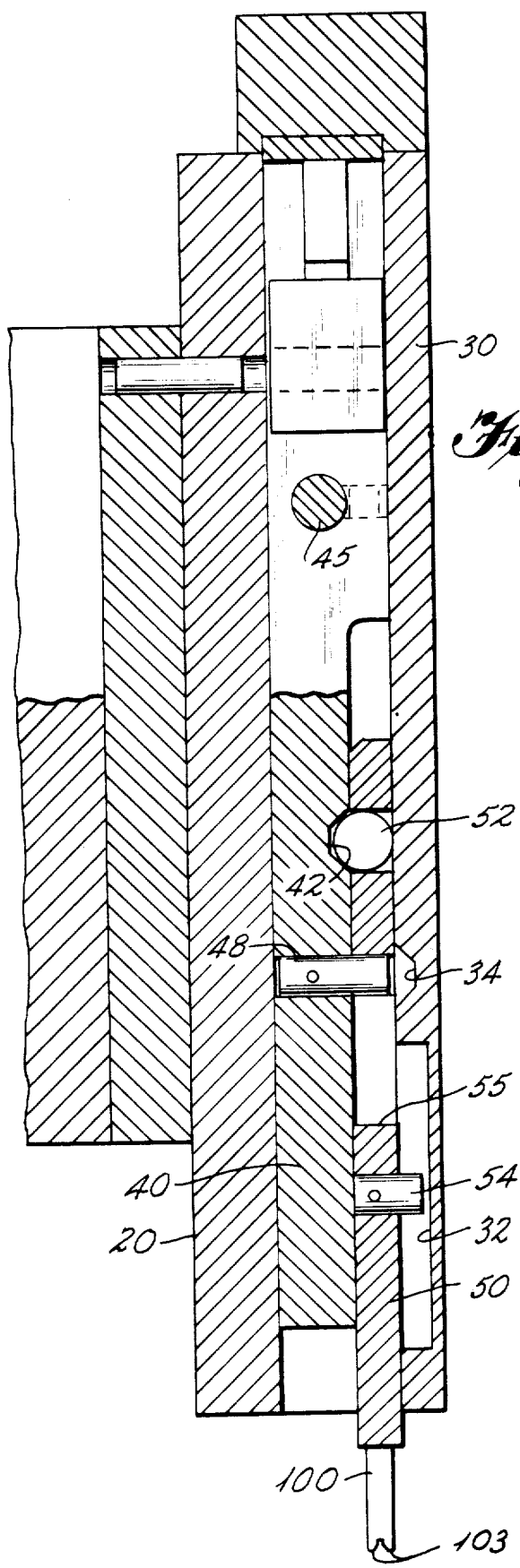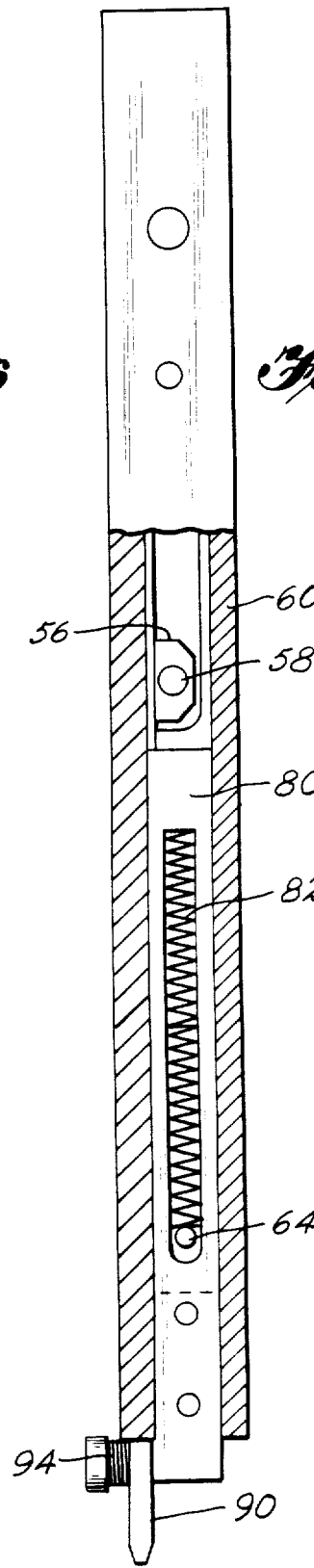

WIRE PIN INSERTION METHOD AND APPARATUS

BACKGROUND AND BRIEF SUMMARY OF THE INVENTION

This invention relates to a method and apparatus for inserting wire pins into substrate holes to form wire wrap connectors for circuit boards, pins of electrical connectors, or the like. The method and apparatus of the present invention are particularly applicable for straightening, feeding, and preforming a continuous length of solid wire to provide a string of interconnected square or round wire wrap pins and for sequentially handling, separating, inserting, and driving a front pin of the string into preformed holes of a printed circuit board in an automatic, in-line, process. Additional preforming of the continuous wire or interconnected, preformed string of wire pins is contemplated to provide a flute-type of deformation of the individual pins in order to provide an interference fit of the pins with the circuit board.

Prior art devices have utilized reels of preformed, interconnected wire pins for insertion into printed circuit board holes. Further, one prior device of which applicants are aware provides for straightening and feeding a continuous length of solid wire to a preform station, preforming the continuous length into interconnected, preformed pins, and inserting the pins individually into selected holes of a printed circuit board. These prior art devices have proven generally to be efficient at handling wire pins, for instance, having a square cross-section with each side of the square having a dimension on the order of 0.045 inches. However, in attempting to handle and properly insert wire pins of smaller cross-sectional dimensions, for instance, the side of a square cross-section on the order of 0.025 inches, great difficulty has been encountered. The greatest difficulties in such an adaptation of prior art devices to handling of pins of such small dimensions has been in the loss of control of the pins and breakage of the means for driving the pins into the holes of the circuit boards. It has been found that, in trying to scale-down the component parts of prior art devices to a size which will handle such small dimension pins, that the parts for handling these pins become so small in cross-section and filmsy that they cannot bear the pressures inherent in such apparatus without breaking at fairly regular intervals of use. It has also been found, in the in-line continuous feeding, forming, and inserting apparatus of the prior art, that loss of control of an individual pin often occurs upon separation thereof from the string of preformed pins during reorientation of a separated pin for insertion into the circuit board hole.

Accordingly, among other objects which will become apparent from the following description, it is an object of the instant invention to handle square or round cross-section wire pins of smaller dimensions than heretofore possible in a consistent, continuous, and automatic manner of feeding, forming, and inserting of the pins into selected holes of a circuit board, without loss of control of the pin once it has been disconnected from a string of preformed pins and while providing an apparatus which consistently inserts the separated pin into the circuit board without the well-known "down times" associated with breakage of insert tooling that occurs when handling pins of such small dimensional cross-sections.

In obtaining the objects of the instant invention, wire stock is fed from a reel supply through an in-line series of wire-straightening rollers, an incremental feeder, and swaging tools for preforming the wire into a string of interconnected preformed pins. The string of preformed pins is fed at an angle to the plane of a printed circuit board into an insertion head which separates an individual pin from the string, while controlling the individual pin during a reorientation thereof for insertion into a circuit board hole and driving the reoriented pin into the hole. The particular means for controlling pins of such small cross-sectional dimensions will be better understood from the following description.

BRIEF DESCRIPTION OF THE DRAWINGS

FIGS. 2a and 2b are, respectively, partial isometric views of a string of interconnected wire pins having square and round cross-sections.

FIG. 2c illustrates a pin of the string of FIG. 2a which has the additional feature of a mounting flute provided in the body of the pin.

FIG. 2d is a cross-section as viewed along the arrows 2d—2d of FIG. 2c.

FIG. 5 is a front view of the insert head of FIG. 1 with the front cover removed.

FIG. 6 is a cross-section of the insert head, as viewed along arrows 6—6 of FIG. 5.

FIG. 7 is a cross-section of the insert head, as viewed along arrows 7—7 of FIG. 5.

FIG. 8 is a cross-section of the insert head, partially broken away, as viewed along arrows 8—8 of FIG. 5.

FIGS. 9a-9d depict the arrangement of the bender blade, driver, and flipper of the insert head during the insert cycle.

Similar reference characters refer to similar parts throughout the several views of the drawings.

DETAILED DESCRIPTION OF THE INVENTION

Figure 1:
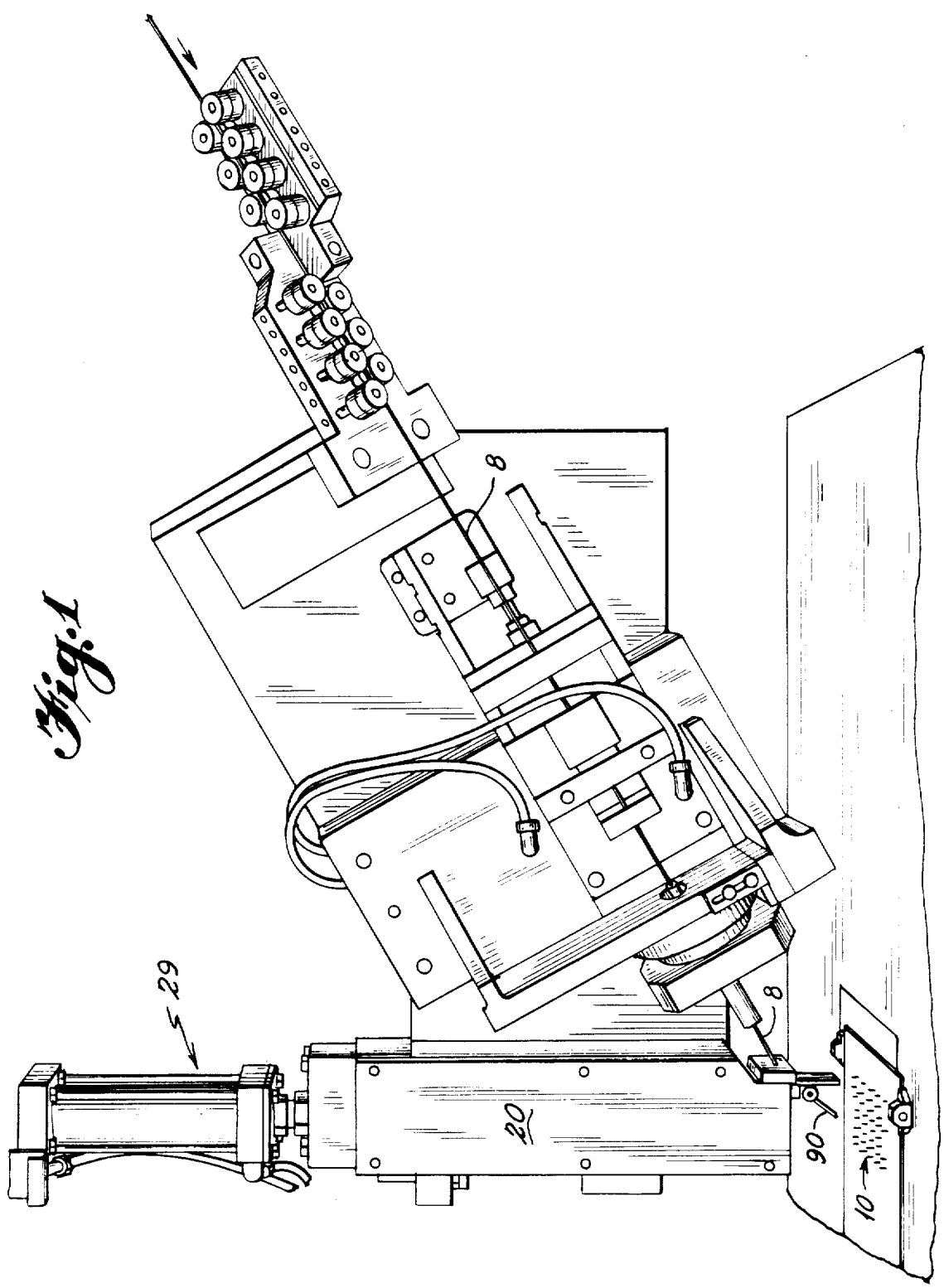
FIG. 1 is a perspective view of the overall apparatus for straightening, feeding, preforming, and inserting wire pins into selected holes of a circuit board.

Referring to FIG. 1, a continuous length of solid wire 8 is fed from a reel supply (not shown) through wire straightener rollers 4 by means of incremental wire gripper and feeder 6, and, thence, through swage tooling 2. In swage tooling 2, wire stock 8 is converted to a string of interconnected individual wire pins 10 (as best seen in FIGS. 2a and 2b) for subsequent feed into the insert head. The wire pins may have the several different configurations of FIGS. 2a-2c. FIG. 2a shows a string of interconnected pins 10 having generally square cross-sections and interconnected by generally truncated, pyramidal end portions 12. FIG. 2b discloses a string of pins in which the cross-section for each pin is generally circular. Referring to FIG. 2c, an additional preform has been supplied by swage tooling 2 to indent opposite sides of the pin 10, as at 14, and provide a flute 16 by which an interference fit may be made with the circuit board upon insertion of the pin 10 into a hole thereof.

Figure 3:
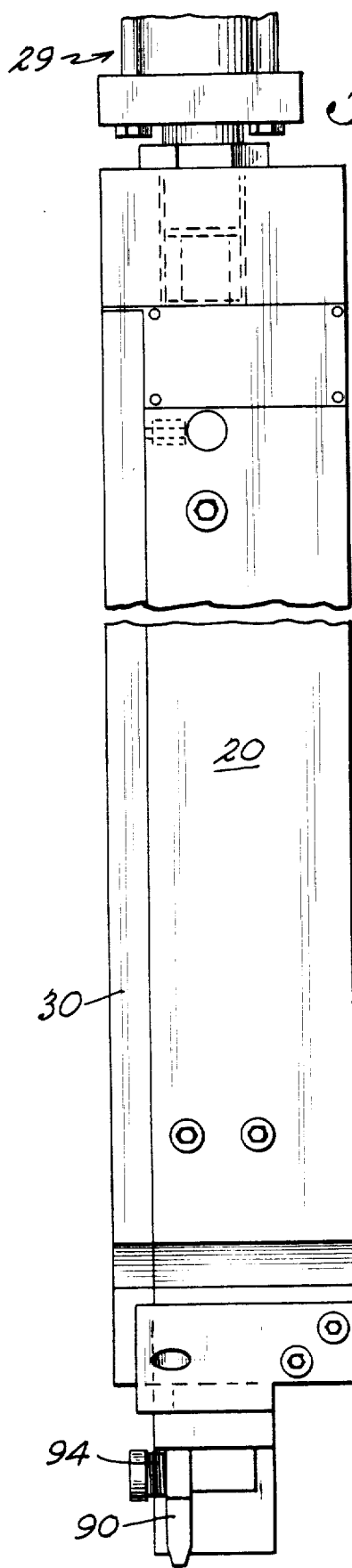
FIG. 3 is a right-side elevation of the insert head of FIG. 1.
Figure 4:
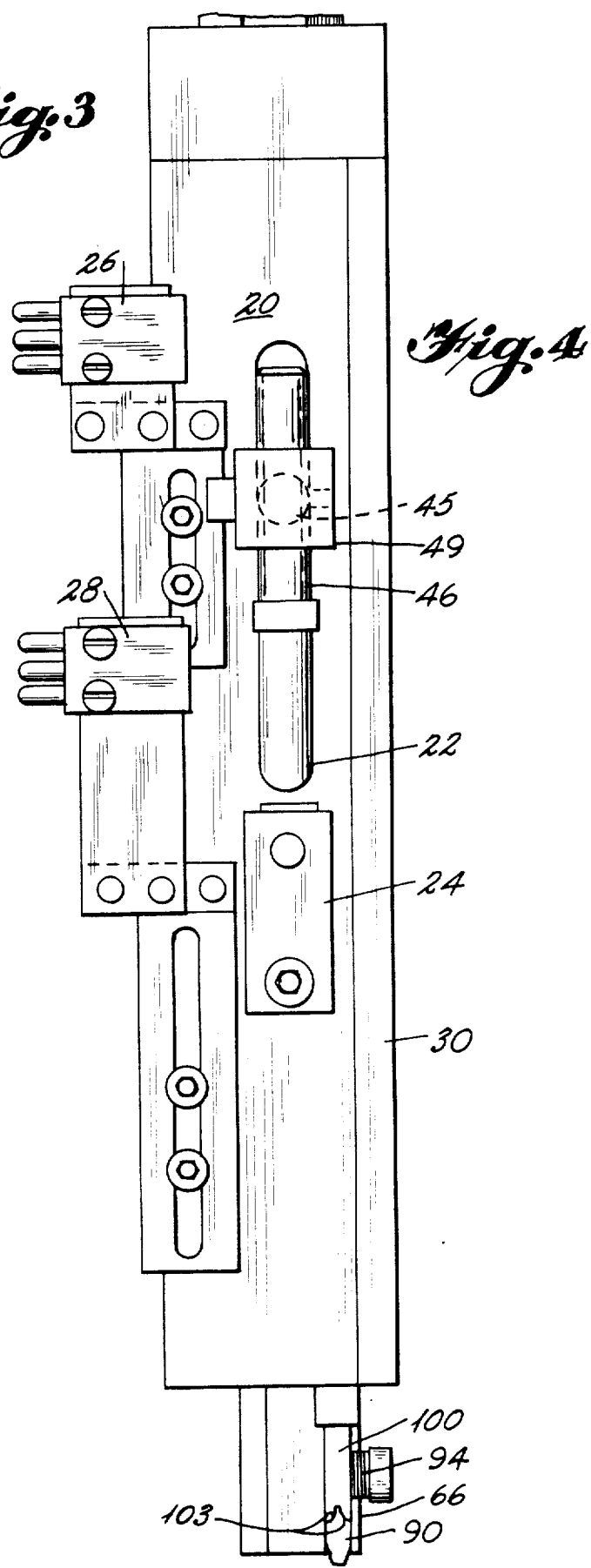
FIG. 4 is a left-side elevation of the insert head of FIG. 1.

Referring to FIGS. 3-6, the insert head includes a housing 20 having a generally U-shaped channel therein covered by face plate 30 (as seen in FIGS. 3 and 4). Attached to the top end of the insert head is a cylinder 29, the piston of which extends into housing 20 and attaches to a main carrier 40 as by clevis 44. Main carrier 40 is reciprocated within the channel of housing 20 by the stroking of cylinder 29, with the mid-stroke position disclosed in FIGS. 3-8 for ease of illustration of the various component parts. Attached to main carrier 40, as by a set screw, is horizontal rod 45 which extends out through slot 22 in housing 20. Rod 45 has bracket 49, attached to the end thereof which extends outside of housing 20, supporting a threaded stroker adjuster 46 and a magnet 47. Magnet 47 is for actuation of "Hall effect" switches 26 and 28 to indicate, respectively, the fully retracted and extended stroke positions. Stroke adjuster 46 is threadable into or out of bracket 49 and engageable with stroke stop member 24 during the extension stroke. As seen in FIG. 5, main carrier 40 has a driver carrier 70 affixedly attached thereto and, as seen in FIG. 6, has a blade carrier 50 releasably engaged therewith during a portion of the stroke. This "clutching" of blade carrier 50 to main carrier 40 is provided by a slot and rod-like detent at 52. Main carrier 40 has a main carrier detent 42 for receiving a portion of the clutching rod 52 such that main carrier 40 and blade carrier 50 reciprocate together during engagement of clutch rod 52 in main carrier detent 42. Guide dowel 48 is attached to main carrier 40 and is slidable in slot 55 of blade carrier 50 to retain the appropriate relative positions between the parts. In turn, blade carrier 50 has a guide dowel 54 slidable within guide groove 32 of front cover 30. As may be further appreciated by reference to FIG. 6, blade carrier 50 is disengaged from main carrier 40, after main carrier 40 has extended a selected amount, by shifting of clutch rod 52 out of main carrier detent 42 and into another detent 34 in cover 30. Of course, during retraction of main carrier 40, the opposite "clutching" occurs such that blade carrier 50 is again engaged with and travels with main carrier 40. As best seen with reference to FIGS. 5, 7, and 8, blade carrier 50 also includes a pin 58 attached to an ear 56 such that pin 58 does not engage with driver carrier 70 during reciprocation of blade carrier 50. Extending substantially the full length of the U-shaped channel of housing 20 is a spacer bar 60 having groove 62 therein (FIG. 5) and pin 64 press fit therein (FIG. 8). Slidable within groove 62 is a flipper carrier 80 which is provided with a slot for reception of compression spring 82 bearing against pin 64 of spacer bar 60 such that flipper carrier 80 is biased upwardly. Pin 58 of blade carrier 50 also is slidably received in groove 62 of spacer 60 and, during extension of blade carrier 50, engages the top portion of flipper carrier 80 to cause downward movement thereof against the bias of spring 82.

Figure 10:
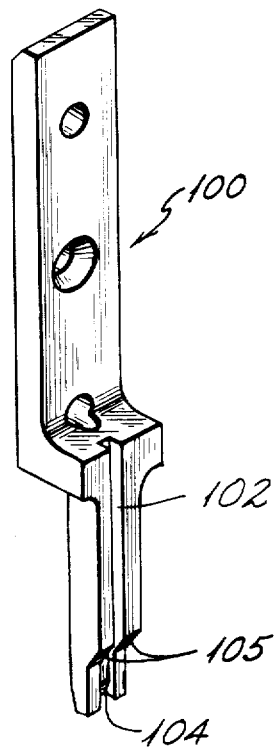
FIG. 10 is an isometric view of the bender blade of the insert head.
Figure 12:
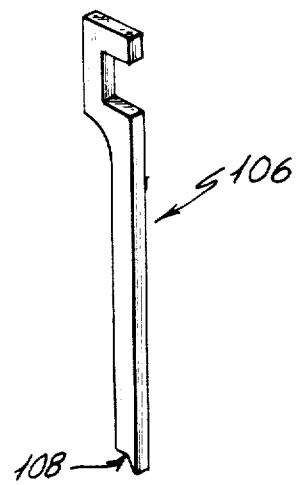
FIG. 12 is an isometric view of the driver of the insert head.
Figure 11A:
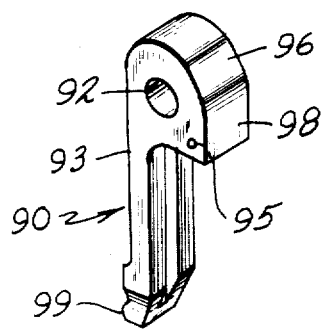
FIGS. 11a and 11b are isometric views of the flipper of the insert head.
Figure 11B:
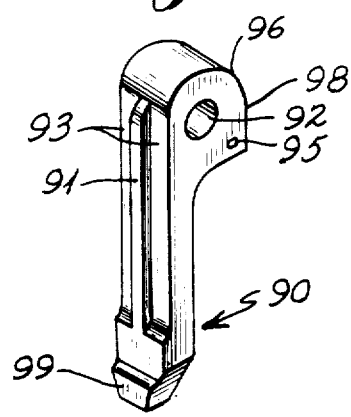

As described so far, the insertion head is generally prior art, and the remaining portion of the description thereof deals particularly with the instant invention. Attached to the lower ends of blade carrier 50, driver carrier 70, and flipper carrier 80 are, respectively, a bender blade 100, driver 106, and flipper 90. The particular structures of bender blade 100, driver 106, and flipper 90 may be appreciated with reference to FIGS. 10-12. In FIG. 10, bender blade 100 has a slot 102 within which driver 106 may reciprocate, as well as a generally forked end 104 for a purpose yet to be described. In FIG. 11, flipper 90 is pivotally supported at 92, and the face thereof is cut away as at 93 to provide a central rail 91 which substantially closes slot 102 of bender blade 100 when in the extended position. Flipper 90 also comprises an angled tip 99 and first and second stop flats 96 and 98. A pin 95 is affixed to flipper 90 and is attached to one end of a spring 94 (best seen in FIGS. 8, 9a-9d, and 3) which is mounted about pivot point 92 for the purpose of urging the flipper in the clockwise direction (of FIG. 5), as will be described further. In FIG. 12, it may be seen that driver 106 includes an altered tip 108 for a purpose also yet to be described. Spacer bar 60 is extended, as at 66 (FIGS. 9a-9d), for cooperation with first and second flats 96 and 98 of flipper bar 90. The general orientation of the bender blade 100, driver 106, flipper 90, and extension 66, when in position for receiving a wire pin for separation from preformed string 8 and insertion thereof into a circuit board hole, may be seen in FIG. 9.

INSERTION HEAD OPERATION

Keeping in mind that the movable component parts are illustrated in the mid-stroke position in FIGS. 3-8, reference should be made to FIG. 9a for an understanding of the relative positions of the bender blade 100, driver 106, and flipper 90 just prior to separation of an individual wire pin 10 from a string 8 of preformed wire pins. For each wire pin 10 that is to be inserted into a circuit board hole, stock wire 8 is gripped and fed by feeder 6 to swage tooling 2 and a circuit board support is raised into engagement with the bottom of the circuit board. These movements are sensed (by a means not shown) and the insert tooling is fired by cylinder 29 such that main carrier 40 and blade carrier 50 move downwardly together (nominally 1.875 inches) till clutch rod 52 rides into front cover detent 34 and disengages the bender blade carrier 50 from main carrier 40. Since driver carrier 70 is attached to main carrier 40, it continues downwardly with main carrier 40 for the full extended stroke as determined by stroke adjuster 46 engaging stop block 24. Before bender carrier 50 disengages from main carrier 40, pin 58, attached to bender carrier 50, engages the top end of flipper carrier 80 to cause downward movement of flipper carrier 80 in opposition to the biasing of spring 82. Thus, flipper carrier 80 moves downwardly with bender carrier 50 until bender carrier 50 is disengaged from main carrier 40.

Figure 9B:
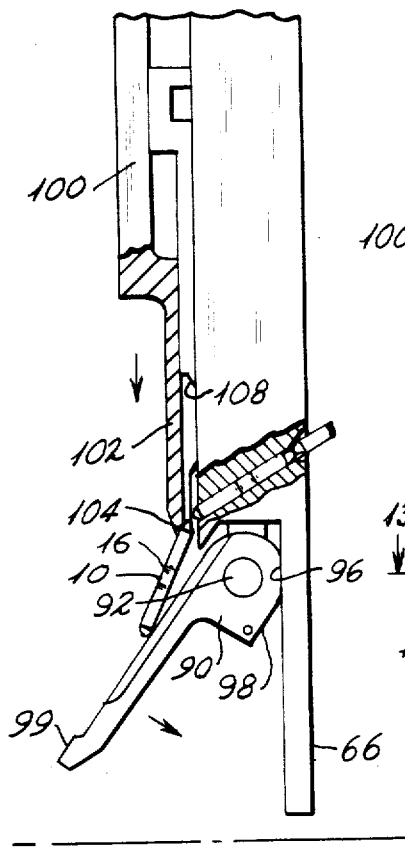
Figure 9C:
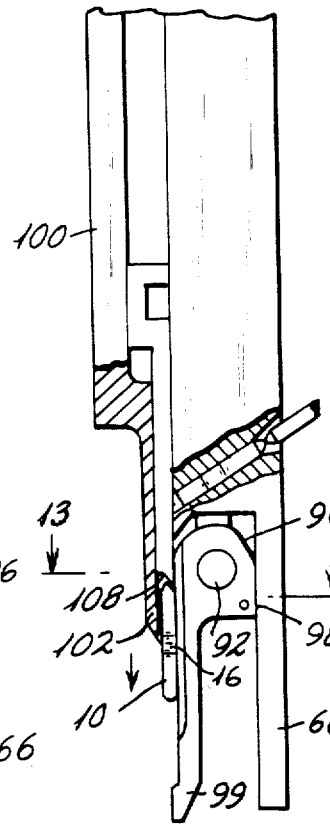
Figure 9D:
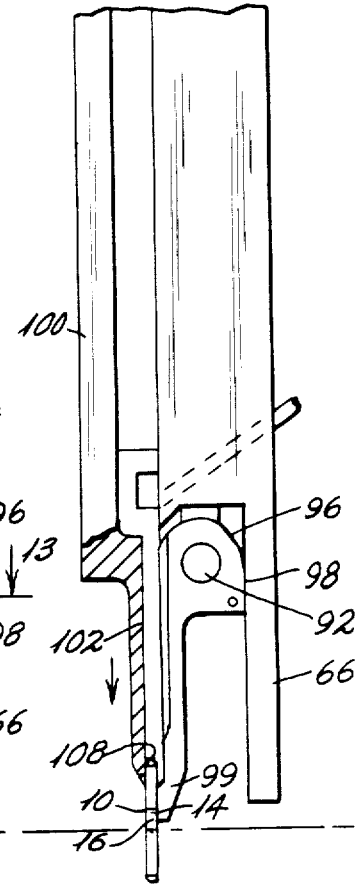

Referring to FIG. 9a, flipper 90 is biased to its fully clockwise position by spring 94, with the limit for this clockwise position provided by first flat 96 engaging stop extension 66, and a wire pin 10 of the string of preformed wire pins 8 is in position for the separation, reorientation, and insertion thereof into a circuit board hole. During the extension stroke, bender blade 100 moves downwardly such that forked portion 104 thereof engages, bends, and guides wire pin 10 as it is reoriented from the angle shown to a generally vertical position, as seen in FIGS. 9a-9d. During this downward movement of bender blade 100, wire pin 10 is captured within slot 102 and, during the bending, wire pin 10 engages guide strip 91 of flipper 90. Wire pin 10 bends at interconnection point 12 and separates from the remaining portion of wire string 8 according to the characteristics of the wire and the reduced cross-section at interconnection 12. When a wire pin 10 is not provided with the interference fit flute 16 of FIGS. 2c and 2d, and depending upon the variables mentioned above, separation of wire pin 10 from string 8 occurs sometime after engagement by forked portion 104 of bender blade 100. It has been noted that in some instances, wire pin 10 is completely oriented to the generally vertical position while still attached to string 8 by interconnection 12, and separation does not occur until driver 106 engages the rear end of pin 10 in the general location of interconnection 12 of pin 10 with string 8. Of course, this depends upon the tensile forces and amount of reduction of the cross-sectional area provided in the preformed interconnection 12 of the wire string 10. It is preferred, due to the fragility of driver 106, that separation occur prior to engagement of driver 106 with wire pin 10. In fact, when the wire pins have been provided with the interference fit fluting 16 (FIGS. 2c and 2d) and properly oriented relative to the insert head, bender blade portions 103 (as seen in FIGS. 4, 6, and 7) will engage fluting 16 after forked portion 104 has moved down the length of pin 10 during bending thereof such that separation of pin 10 from string 8 can be caused to occur before engagement of driver 106 with pin 10. Of course, the wire pins being fed into the insert head may have varying lengths such that the length of driver 106 must be provided in accordance therewith.

Figure 13:
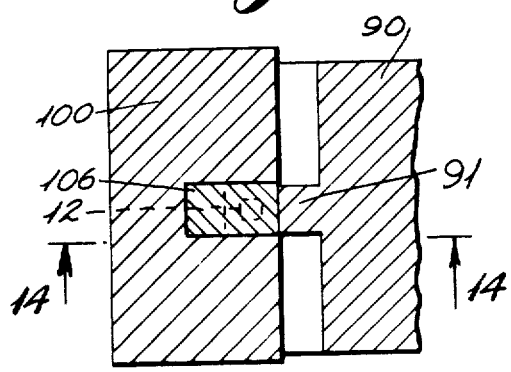
FIG. 13 is a partial cross-section, as viewed approximately along the arrows 13—13.
Figure 14:
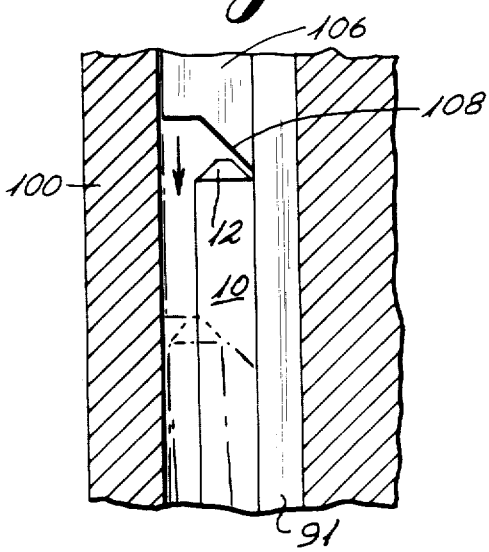
FIG. 14 is an enlarged, partial cross-section illustrating the functioning of driver in repositioning one end of the pin.

Prior to the provision of flipper 90, it was found that, even in square wire pins of approximately 0.045 inches on a side, that the separated pin would sometimes flip out of control and away from the insert head upon separation from wire string 8. Flipper 90 has been found to prevent this problem by yieldingly engaging wire pin 10 before pin 10 has been oriented to the generally vertical direction and separated from string 8. Additionally, the instant invention has provided a means for dependably handling, controlling, and driving the wire pin 10 into the circuit board without breakage of the component parts of the insert head, especially when dealing with wire of such reduced cross-sectional dimensions as a square wire pin of approximately 0.025 inches on a side. Initially, attempts were made to adapt a prior art insert head used for square wire pins having a larger cross-section (nominally 0.045 inches on a side) to insertion of square wire pins having a smaller cross-section (nominally 0.025 inches on a side) by reducing the dimensions of a bender slot and driver, somewhat similar to bender slot 102 and driver 106, such that the wire pin would just slidingly be acceptable in the slot and the driver would have a cross-section exactly equal to that of the pin. However, such a reduced cross-section of driver 106 made it more fragile and subject to constant breakage during operation. Accordingly, the apparatus of the instant invention was devised to prevent such breakage by reducing the width of slot 102 to barely receive the width of the pin 10, while deepening slot 102 such that there would be a loose fit in one direction (FIG. 13). Driver 106 was reduced in one direction so that it would closely telescope within slot 102 and was further provided with an altered tip 108 (as seen in FIGS. 12 and 14). By reducing the cross-section of driver 106 in only one dimension, it was found that there was sufficient strength in driver 106 to prevent breakage during use. The purpose of the altered tip 108 is to engage one end 12 of pin 10 and urge that end into the bottom of slot 102 (left-hand side, phantom-lined position as viewed in FIG. 14). Prior to engagement of driver tip 108 with pin 10, flipper guide strip 91 urges the free end of pin 10 (as viewed in FIG. 9) against the bottom of slot 102 during reorientation of the pin 10. Bender blade 100 has further been provided with a tip relief 105, in the general area of which slot 102 is of the same cross-section as the wire pin 10, such that tip 99 of flipper 90 fits into relief 105 to hold pin 10 in correct relationship within slot 102 during insertion and driving of the pin into the circuit board hole. During the pivotal motion of flipper 90 in the counterclockwise direction against the biasing of spring 94, flat 98 engages with stop extension 96 to ensure this vertical orientation. Thus, it should be appreciated that the free end of wire 10 is held closely in slot 102 by flipper guide strip 91 during bending thereof and, upon engagement of the upper end of wire pin 10 by driver tip 108, this upper end also is urged into close engagement with the bottom of slot 102. Accordingly, a wire pin of reduced cross-section (nominally 0.025 inches) is handled without loss of control and without the usual problem of breakage of the component parts of the insert head.

Although not emphasized in the preferred embodiment, it should be readily apparent to one skilled in the art that wire pins of other cross-sectional shapes, such as generally circular, elliptical, or rectangular cross-sections could be handled by the apparatus of the instant invention. It should also be appreciated that, although preferred, it is conceivable that the wire pins need not be interconnected in their feeding into the insert head and that, with certain malleable metals, preforming of the ends of a string of interconnected pins need not be accomplished prior to handling by the insert head.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Now that the invention has been described, what is claimed as new and is desired to be secured by Letters Patent is:

1. A method for cyclically inserting and driving a wire pin of a string of end-to-end connected pins into a substrate hole, each of said pins having a longitudinal axis and preformed, reduced cross-section areas of interconnection between pins of said string to provide a front end and a rear end for each pin, said method comprising the steps of:

receiving said pin with said longitudinal axis at an angle to a central axis of said hole;

engaging said pin rear end and changing said angle and engaging said front end to urge a portion of said pin into a guide slot during said angle changing and generally aligning said longitudinal and central axes for said inserting, said guide slot having internal faces;

separating said pin from said string;

yieldingly engaging said front end and preventing loss of control of said pin during said angle changing; and driving said pin into said hole while engaging and urging said rear end into sliding engagement with said faces of said slot during said driving and prior to said inserting, such that guiding and said aligning of said pin occurs.

2. A method for cyclically inserting and driving a wire pin of a string of end-to-end connected pins into a substrate hole, each of said pins having a longitudinal axis, reduced cross-section areas of interconnection between pins of said string to provide a front end and a rear end for each pin, and means, enlarged in at least one cross-sectional dimension relative to a pin body cross-section, for providing an interference fit in said hole, said method comprising the steps of:

receiving said pin with said longitudinal axis at an angle to a central axis of said hole;

engaging said pin and changing said angle and generally aligning said longitudinal and central axes for said inserting;

yieldingly engaging and preventing loss of control of said pin during said angle changing;

separating said pin from said string by engaging said interference fit providing means and applying a force to said pin generally parallel to said longitudinal axis; and driving said pin into said hole and effecting said interference fit.

3. A method as in claim 2, and further comprising the steps of:

engaging said front end during said angle changing and urging a portion of said pin into a guide slot; and engaging and urging said rear end into said slot, such that guiding and said aligning of said pin occurs with said pin having at least one cross-sectional dimension smaller than at least one cross-sectional dimension of said slot.

4. An apparatus for cyclically inserting and driving a wire pin of a string of end-to-end connected pins into a hole of a substrate, each of said pins having a longitudinal axis, reduced cross-section areas of interconnection between pins of said string to provide a front end and a rear end for each pin, and means, enlarged in at least one cross-sectional dimension relative to a pin body cross-section, for providing an interference fit in said hole, said apparatus comprising:

means for supporting said apparatus adjacent said substrate;

means operatively associated with said support means for receiving said pin with said longitudinal axis at an angle to a central axis of said hole;

means, operatively associated with and moveable relative to said receiving means, for engaging said pin and changing said angle and generally aligning said longitudinal and central axes for said inserting, said pin being fed to said engaging means from said receiving means;

means, moveable relative to and operatively associated with said angle changing means, for yieldingly engaging and preventing loss of control of said pin during said angle changing;

means, operatively associated with said angle changing means, for engaging said interference fit providing means after said angle changing and for separating said pin from said string by applying a force thretо generally parallel to said longitudinal axis;

means, operatively associated with and moveable relative to said separating means, for driving said pin into said hole and effecting said interference fit; and means, operatively associated with said engaging and driving means, for actuating said engaging and driving means.

5. An apparatus for cyclically inserting and driving a wire pin of a string of end-to-end connected pins into a hole of a substrate, each of said pins having a longitudinal axis and preformed, reduced cross-section areas of interconnection between pins of said string to provide a front end and a rear end for each pin, said apparatus comprising:

means for supporting said apparatus adjacent said substrate;

means, operatively associated with said support means, for receiving said pin with said longitudinal axis at an angle to a central axis of said hole, engaging said pin rear end and changing said angle, engaging said front end to urge a portion of said pin into a guide slot during said angle changing, and generally aligning said longitudinal and central axes for said inserting, said guide slot being generally U-shaped and having a bottom face and side faces;

means, operatively associated with and moveable relative to said receiving means, for separating said pin from said string prior to said inserting;

means, moveable relative to and operatively associated with said receiving means, for yieldingly engaging said front end and preventing loss of control of said pin during said angle changing;

means, operatively associated with and moveable relative to said receiving means, for driving said pin into said hole while engaging and urging said rear end into sliding engagement with said bottom face of said guide slot during said driving, and prior to said inserting, said driving means having at least one cross-sectional dimension greater than at least one corresponding cross-sectional dimension of said pin so as to minimize breakage of said driving means; and means operatively associated with said engaging and driving means for actuating said engaging and driving means.

6. An apparatus as in claim 5, wherein said control loss preventing means comprises:

a spring biased, pivotal flipper means for yieldingly engaging said pin front end during said angle changing and for urging a portion of said pin into a guide slot of said angle changing means.

* * * * *